United States Patent
Antaki et al.

(10) Patent No.: US 6,770,213 B2
(45) Date of Patent: Aug. 3, 2004

(54) METHOD OF INSPECTING AN ANISOTROPIC ETCH IN A MICROSTRUCTURE

(75) Inventors: Robert Antaki, St. Luc (CA); Riopel Yan, Bromont (CA)

(73) Assignee: Dalsa Semiconductor Inc., Waterloo (CA)

( * ) Notice: Subject to any disclaimer, the term of this patent is extended or adjusted under 35 U.S.C. 154(b) by 46 days.

(21) Appl. No.: 09/799,495

(22) Filed: Mar. 7, 2001

(65) Prior Publication Data

US 2002/0088769 A1 Jul. 11, 2002

(30) Foreign Application Priority Data

Nov. 18, 2000 (GB) .............................................. 0028182

(51) Int. Cl.⁷ ............................................. G01L 21/30
(52) U.S. Cl. .............................. 216/59; 216/52; 216/58; 216/67; 216/84; 438/14
(58) Field of Search ............................. 216/52, 58, 59, 216/67, 84; 438/14

(56) References Cited

U.S. PATENT DOCUMENTS

| | | | |
|---|---|---|---|
| 4,386,850 A | 6/1983 | Leahy | 356/243 |
| 4,650,744 A | 3/1987 | Amano | 430/313 |
| 5,561,293 A | * 10/1996 | Peng et al. | 250/307 |
| 5,659,562 A | * 8/1997 | Hisa | 372/96 |
| 5,702,982 A | * 12/1997 | Lee et al. | 438/620 |
| 6,012,336 A | * 1/2000 | Eaton et al. | 73/754 |

FOREIGN PATENT DOCUMENTS

| | | | | |
|---|---|---|---|---|
| JP | 60226129 | | 11/1985 | |
| JP | 2028927 A | | 1/1990 | |
| JP | 10125653 | | 5/1998 | |
| JP | 10125653 A | * | 5/1998 | ....... H01L/21/3065 |
| JP | 11258266 | | 9/1999 | |
| JP | 11-258266 A | * | 9/1999 | ........... H01L/29/84 |

OTHER PUBLICATIONS

Wolf et al, "Silicon Processing For The VLSI ERA" vol. 1, 1986, pp. 531–532.*

"Depth and profile control in plasma etched MEMS structures", J. Kiihamäki et al., Sensors and Actuators, vol. 82, pp. 234–238.

* cited by examiner

*Primary Examiner*—Anita Alanko
*Assistant Examiner*—Shamim Ahmed
(74) *Attorney, Agent, or Firm*—Marks & Clerk

(57) ABSTRACT

A method is disclosed for evaluating an anisotropic etch in a microstructure. First a film is formed on a substrate. Next a series of holes of progressively different area and having specific geometric shapes are formed through the film. An anisotropic etch is carried out in the microstructure through the holes by relying on different etch rates in different crystal planes under known and reproducible conditions. Finally, the microstructure is inspected through the holes after the anisotropic etch to compare results from holes of different area. The method is useful in the determination of etch depth.

18 Claims, 1 Drawing Sheet

METHOD OF INSPECTING AN ANISOTROPIC ETCH IN A MICROSTRUCTURE

FIELD OF THE INVENTION

This invention relates to a method of inspecting an anisotropic etch in a microstructure, for example, to measure the depth of an anisotropic etch in a monocrystalline material. A microstructure is any small scale structure, such as a microelectronic devices on wafer used in semiconductor fabrication.

BACKGROUND OF THE INVENTION

Liquid anisotropic etching is used extensively to form holes in semiconductor material. An etchant is chosen such that the etch rate in the vertical direction is greater than the transverse direction. The result is a hole bored into the semiconductor material.

Having formed the hole, it is necessary to know its depth. Many methods of measurement exist. The etch depth can either be measured by contact profilometry, which takes long scanning time, or alternatively by optical interferometry, which requires an expensive and alignment sensitive tool. It can also be done by using the microscope focusing height difference technique. This is time consuming and not reproducible or requires an expensive tool.

What is needed is a quick, reproducible and inexpensive process-integrated method for evaluating the etch depth of an anisotropic etch of a microstructure such as a monocrystalline material.

SUMMARY OF THE INVENTION

According to the present invention there is provided a method of evaluating an anisotropic etch in a microstructure, comprising providing a substrate; forming a film on said substrate; forming a series of holes of progressively different area and having specific geometric shapes through said film; performing an anisotropic etch in said microstructure through said holes by relying on different etch rates in different crystal planes under known and reproducible conditions; and inspecting said microstructure through said holes after said anisotropic etch to compare results from holes of different area.

It will be understood that anisotropic etching relates to the difference in etch rate with regard to direction. One way of achieving an anisotropic etch is to rely on the difference in etch rate with respect to different crystal planes lying at an angle to each other. For example, the etch rate is fast in the etch plane {100} but very slow in the {111} planes, which lies at an angle to the {100} plane.

An anisotropic etch typically produces V-shaped grooves, inverted pyramids or more complex shapes. The etchant quickly eats away at the bottom of the hole being etched, which lies in the {100} plane, but only slowly attacks the walls of the hole formed by the {111} planes. As a result, there comes a certain point where the walls of the groove meet, and at this point the etch essentially stops. The invention makes use of the fact that the depth at which this point occurs depends on the initial area of the hole. The larger the area of the hole, the deeper will be the etch. If the substrate is etched through holes of different diameter, the hole where the walls just meet at the bottom of the V-shaped groove permits the etch depth to be calculated knowing the etch rate ratio for the different planes.

The method of the present invention is typically used for determining the etch depth, but the method can also be used for other types of wafer evaluation.

In the preferred embodiment, many fabrication steps are integrated or common to an anisotropic etching fabrication process of microstructures. The first step requires the formation of masking film resistant to the anisotropic etchant on top of the monocrystaline material. Then patterning and selective etching of that film in geometrical shapes of different dimensions (preferably in increasing or decreasing order) is accomplished. The chosen shapes will permit discrimination of the anisotropic etch depth through visual inspection after this etching step.

The visual inspection can be done either by unaided eye, through an optical microscope, an electron microscope, a robotic inspection system or any other inspection method. The visual or the automatic pattern recognition distinction is made between a different geometrical shape when a partially etched pattern is compared to a completely etched pattern or another partially etched pattern. Each shape is preferably identified with a label to help the inspector to determine the corresponding etch depth. The etch depth can be determined by the last etched shape, be it completely or partially etched, and a different partially etched shape. The number of shapes as well as the resolution of the inspection system determines the precision of the method. For determining the label, the etch rate of the slow etching plane relative to the etch rate of the wafer plane must be considered.

This method may or may not require a precise angular alignment of the patterns to the crystal structure depending on the shape used. The angular alignment of the crystal plane to the wafer surface plane should be tight. That alignment is called the front surface off orientation.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENT

Figure 1A:
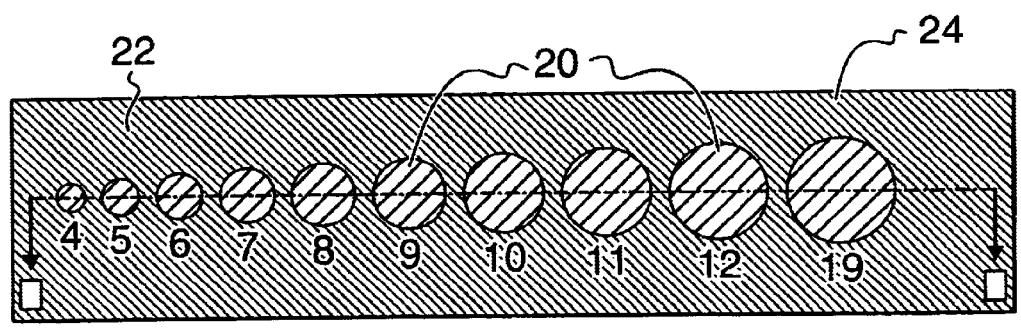
FIGS. 1a and 1b are top and side view respectively of a silicon wafer prior to an anisotropic etch.

In the following example, the object is to inspect a 100 µm anisotropic wet etch depth using etching conditions that can very by 10%. In the example, a series of circular holes 20 number 4 to 12, 19 are patterned in a thin silicon oxide film 22 on to of a {100} type monocrystaline silicon wafer 24, but it will be understood that other geometric shapes can be employed without departing from the principles of the invention.

The fabrication process starts with {100} oriented, N type, 10 to 15 Ωcm monocrystalline silicon wafer, with crystal front surface off orientation of 0±1° and primary flat off orientation of 0±1°.

This wafer is then oxidized up to a silicon oxide thickness of 0.39 µm on both faces of the wafer and then coated with photoresist (1.12 µm thick).

Figure 1B:
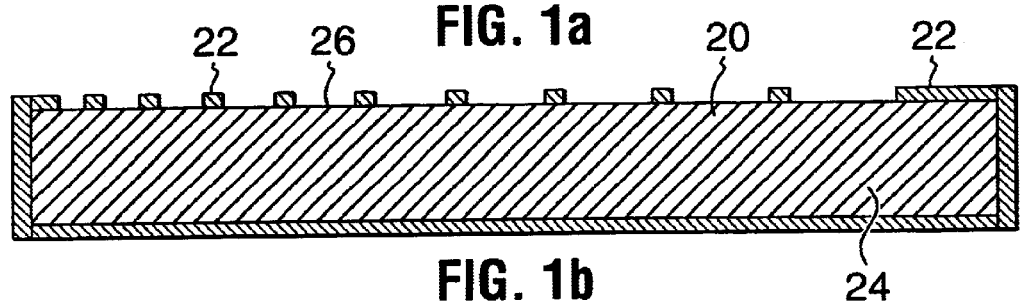

The photoresist is patterned with a photo-lithographic mask containing the structures projected by a projection aligner but without a need for precise alignment to the crystal plane. The photoresist is then developed and then the oxide is etched through the resist holes. As in FIGS. 1a and 1b, the patterns are a series of twenty one circles 20 of diameters increasing in equal steps of 1.345 µm, ranging from 121.0 µm to 147.9 µm with distance center to center ranging from 180 µm to 220 µm.

The substrate is anisotropically etched through the circles of different diameter. As noted above, the etch rate is different for the two crystal planes {100}, {111}. The {100} plane is parallel to the surface. Since the slope of the sidewalls is the same for all the holes, the effective maximum depth for the smaller holes, i.e. the point where the sloping sidewalls meet, will be shallower for the smaller diameter holes and deeper for the larger diameter holes. If the etch is stopped at a certain point in time, the smaller holes will have reached their maximum depth and effectively stopped etching, since their sidewalls will have met, but the larger holes will still not have reached their maximum depth since they will still have portions of the {100} plane exposed. These portions are represented by the flat bottoms 26 in FIG. 2b.

It follows that when the etch is stopped, assuming the circles have progressively smaller diameters, there will be a pair of holes 6, 7 representing the boundary between the holes which have reached their maximum depth and those which still have {100} material exposed. Hole 6 has just reached its maximum depth where the sidewalls meet, yet hole 7 still has some exposed {100} material and thus has some potential additional etch depth remaining. The actual etch depth into the substrate is represented by the etch depth of hole 7, or a notional hole having a diameter somewhere between the diameters of the holes 6 and 7.

In the example, the targeted etch depth is 100 µm. When the targeted etch depth is reached, the circle with diameter of 134.5 µm has just finished etching considering an etch rate ratio of 0.04 for crystal planes {111} with respect to {100}. The circle with diameter 134.5 µm is thus identified 100. The other circles are identified in the same fashion from 90 to 110. The actual formulae are:

$$\text{drawn\_diameter\_circle} = \frac{2 \cdot depth \cdot \left(1 - \frac{R_{\{111\}}/R_{\{100\}}}{\sin(54.74°)}\right)}{\tan(54.74°)}$$

where $R_{\{111\}}$ is the etch rate in crystal planes {111} and $R_{\{100\}}$ is the etch rate in crystal planes {100}. Their ratio is the important factor.

The circles must be kept at a certain distance from one another for the etched shapes not to meet. The actual formulae is:

$$\text{dist.\_between\_conseq.\_circle\_center} = \frac{d_1 + d_2}{\sqrt{2}} + 5\%\_\text{error\_margin}$$

where $d_1$ and $d_2$ are the diameters of the circles.

Prior to performing the anisotropic etch, the oxide film 20 is plasma etched from the starting thickness of 0.39 microns down to 0.04 µm through the photoresist patterns in a timed etch. The preferred plasma etch is based on a $CF_4$—$CHF_3$—Ar chemistry in an Applied 5000 oxide chamber. That etch must ensure no overetch, but should consume most of the oxide on the top side of the wafer. The oxide etch then is completed to the silicon with a wet HF (17:1) timed etch ensuring hydrophobia on the top side of the wafer and preventing the backside from losing too much oxide.

Figure 2A:
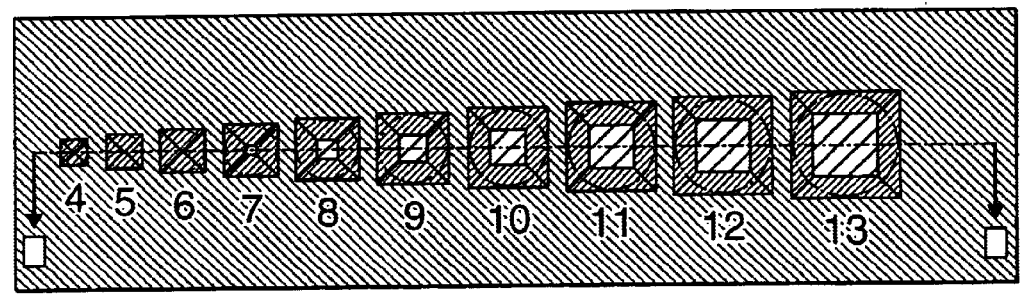
FIGS. 2a and 2b are top and side view respectively of a silicon wafer after an anisotropic etch.
Figure 2B:
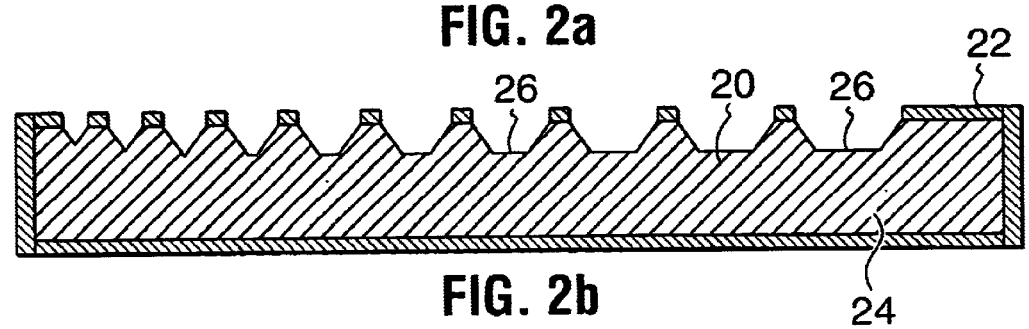

The photoresist is then stripped from the wafer. Subsequently, the wafer is wet etched in a Tetra-Methyl-Ammonium-Hydroxide (TMAH) solution in water (25 wt % TMAH in water) at 90° C. for 165 minutes with a static wafer in a circulated solution. The result of this etch is shown in FIGS. 2a and 2b.

After being rinsed and dried, the wafer is ready for inspection. The inspection is done through an optical microscope at 10 or 20× objective. The inspector first finds the set of circles on the wafer. Since silicon oxide is quite transparent, the circular shape will be slightly noticeable, but the etched shape underneath will be quite visible. Then the inspector scans the larger circles (right side of FIG. 2). They all have an etched shape delimited by a bottom that is square, flat and light-reflecting and also delimited by 4 to 8 sidewalls sloped and gray. Then the inspector continues the scan towards the smaller circles and notices the square bottoms shrinking. At a certain location in the set of circles, the square becomes a point and that etched shape also has 4 very smooth gray sidewalls. The smaller circles also have pointed bottoms (left side of FIG. 2). The etch depth in microns is a number between the identification number of the small circle (with sharp pointed bottom) and the identification number of the contiguous bigger circle (flat square bottom). In FIG. 2b, the etch depth corresponds to a notional hole having a diameter between holes 6 and 7.

The expected uncertainty in this method is 1 µm for visual/optical limitations plus 1% for the etch rate ratio between {111} and {100} planes.

In addition to being used for depth measurement, this method can be used for screening good samples, bad samples, and samples that need added etching. The method can also be used for other reasons including etch rate evaluation and etching system monitoring.

This visual inspection method can also be part of a measurement strategy.

The target wet anisotropic etch depth can be deeper or shallower than the preferred 100 µm depending on the device requirement. It can vary from 1 µm to substrate thickness.

The orientation, doping type, size and flat locations of the silicon wafer can be different than the preferred {100} orientation N-type 150 mm diameter silicon wafer using its major flat as "coarse" alignment to its crystal planes.

The silicon wafer could be specified with a poorer or a tighter crystal plane orientation and wafer flat orientation than the preferred ±1°. The wafer could have another type of alignment mark such as a notch or no mark at all depending on the type of shape.

The protective film can be thinner or thicker than the preferred 0.39 µm. It can also be another material than silicon oxide, provided it will resist in the wet anisotropic etchant and that it can be patterned.

Photoresist thickness can differ from the preferred 1.12 µm thickness, provided it will resist in the protective film etching and that it can be patterned.

The photoresist step could be the same/be part of the protective film if the protective film can be directly patterned in the photolithographic mask aligner and will resist the anisotropic etchant.

All initial/drawn shapes could be used (circles, squares, other polygons: regular, symmetric or other, or other shapes), on the photolithographic mask and all final shapes (partial and complete) can also be used to evaluate the depth. The principle behind the choice of structure is to ensure that there are at least two definitely distinct etched shapes depending on etch depth or etch time in the anisotropic wet etch.

The use of certain shapes, such as squares could require a precise alignment to the crystal planes using an alignment method described in our copending application.

Any suitable arrangement of the set of shapes (in line, in square, staggered . . . ) can be used instead of the preferred linear arrangement.

The identification of the shapes can be letters, symbols or other shapes instead of the preferred number labels. Alternatively, no identification could also be used, in which case the shapes would be identified by their position.

The photo-lithographic mask containing the structures can be transferred with different types of aligners. For example, it could be transferred by a contact aligner, a projection aligner, by a stepper or by another type of aligner that has the necessary resolution.

The number of shapes can vary from two to as many as the substrate can hold. The spacing of the shapes can vary, as long as they do not touch in the initial shape.

The sizes of the shapes can be different from the aforementioned sizes. The formulae relating shape size to etch depth will change depending on the shape, and the substrate and the etching chemistry. The etch rate ratio for the crystal planes will change with chemistry changes and will thus have an impact on the choice of the sizes.

The size interval can also be different from the preferred 1.345 $\mu$m step. The intervals could also not be equal.

The plasma oxide etch chemistry could be different from the $CF_4$—$CHF_3$—Ar chemistry and could be done in a different plasma etcher than the preferred Applied Materials 5000.

The plasma oxide etch depth/duration can also be different from the preferred 0.35 $\mu$m. The protective wet etch could also be of different chemistry and strategy. The protective film etching strategy could be different from the preferred plasma oxide etch followed by the wet oxide etch. For example, the substrate selective wet etch could be removed if a substrate detection based plasma etch of the oxide were used or if a substrate selective plasma oxide etch were used.

The protective etch strategy could certainly be different from the preferred strategy if the chosen protective film is different from the preferred silicon oxide.

The photoresist stripping step could be skipped. That film would then be etched away in the wet anisotropic etch (TMAH) as long as it does not disturb the etching properties.

The concentration of the Tetra-Methyl-Ammonium-Hydroxide (TMAH) solution in water can be higher or lower than the preferred 25% TMAH in water.

The temperature of the Tetra-Methyl-Ammonium-Hydroxide (TMAH) solution can be different then the preferred 900° C.

The wet etch solution could be different from the preferred Tetra-Methyl-Ammonium-Hydroxide (TMAH) solution so as to provide various etch rates for the various crystal plane orientations of the silicon wafer. Alternate solutions include Potassium Hydroxide (KOH), Sodium Hydroxide (NaOH), Ammonium Hydroxide (NH4OH), Hydrazine, Ethylene Diamine Pyrocatechol (EDP), Tetra Methyl Ammonium Hydroxide (TMAH) and all quaternary ammonium hydroxides such as Tetra Ethyl Ammonium Hydroxide (TEAH) and Tetra Propyl Ammonium Hydroxide (TPAH). All strong caustic or basic etching solution behave in the same fashion and can serve as an alternative.

The element of the single crystal substrate itself could be different than the preferred silicon. In fact, other elements such as germanium, Ge, and other compounds such as gallium arsenide, GaAs or indium phosphide, InP, could be used if a wet etch, using an appropriate etchant, of that different substrate can result in different etch rates along the crystal planes.

Many inspection methods could be used instead of the human inspection with microscope. For example, the optical microscope could be replaced by Scanning Electron Microscopy. Also, the inspection could be done by robotic viewing system and computer pattern recognition.

The invention can be used in many photonics devices such as optical switches based on rotating or vibrating mirrors. Micro Electro Mechanical Systems (MEMS) for various applications can also use this invention as to check etch depth.

What is claimed is:

1. A method of determining etch depth in a microstructure, comprising:

providing a substrate;

forming a protective film on said substrate;

forming a series of holes of progressively different area and having specific geometric shapes through said film;

performing an anisotropic etch in said microstructure through said holes to form hollow structures with inclined walls by relying on different etch rates in different crystal planes under known and reproducible conditions, said hollow structures reaching a maximum depth when said inclined walls meet; and inspecting said microstructure through said holes after said anisotropic etch to compare said hollow structures associated with holes of different area;

identifying a particular said hollow structure of structures representing the boundary between those structures that have reached their maximum depth and those structures that have not; and deriving the etch depth at said boundary from the area of the associated holes or holes and the etch rate ratio for the different crystal planes.

2. A method as claimed in claim 1 wherein a first said hollow structure is identified that corresponds to the smallest hole with exposed material at the bottom of the hollow structure, and a second said hollow structure is identified that corresponds to the next hole in the series that is smaller than said smallest hole and next in sequence, and the etch depth is derived by interpolation from a notional hole located between said smallest hole and said next hole.

3. A method as claimed in claim 2, wherein said hole with said exposed material has a flat bottom.

4. A method as claimed in claim 1 wherein said holes are organized in order of decreasing area.

5. A method as claimed in claim 4, wherein said holes are arranged in a linear arrangement.

6. A method as claimed in claim 1, wherein prior to formation of said holes in said protective film said microstructure is covered with photoresist, patterned, and then said holes are formed initially by plasma etching.

7. A method as claimed in claim 6, wherein said plasma etch is based an a $CF_4$—$CHF_3$—AR chemistry.

8. A method as claimed in claim 7, wherein said holes are completed in said protective film with a wet HF etch.

9. A method as claimed in claim 1, wherein said protective film is an oxide film.

10. A method as claimed in claim 1, wherein said microstructure is a monocrystalline structure.

11. A method as claimed in claim 10, wherein monocrystalline structure is silicon.

12. A method as claimed in claim 10, wherein said monocrystalline structure has an orientation on top of approximately {100}.

13. A method as claimed in claim 1, wherein the holes are labeled according to corresponding etch depth.

14. A method as claimed in claim 1, wherein the intervals between the areas of holes are constant.

15. A method as claimed in claim 1, wherein the anisotropic etch is carried out with a TMAH solution.

16. A method as claimed in claim 1, wherein the holes are inspected after etching with an automatic scanning system.

17. A method as claimed in claim 1, wherein the substrate is {100} oriented silicon and said etch depth is derived using the formula:

$$\text{drawn\_diameter\_circle} = \frac{2 \cdot depth \cdot \left(1 - \frac{R_1/R_2}{\sin(54.74°)}\right)}{\tan(54.74°)}$$

where $R_1/R_2$ is the ratio of etch rates in the respective crystal planes of the anisotropic etch.

18. A method as claimed in claim 1, wherein said crystal planes are {100} and {111}.

* * * * *